(12) United States Patent
Daimon et al.

(10) Patent No.: US 12,426,513 B2
(45) Date of Patent: Sep. 23, 2025

(54) ACOUSTIC WAVE DEVICE WITH ELECTRODE FINGERS MADE OF AN ALLOY

(71) Applicant: Murata Manufacturing Co., Ltd., Nagaokakyo (JP)

(72) Inventors: Katsuya Daimon, Nagaokakyo (JP); Yasumasa Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 738 days.

(21) Appl. No.: 17/863,448

(22) Filed: Jul. 13, 2022

(65) Prior Publication Data

US 2022/0344566 A1 Oct. 27, 2022

Related U.S. Application Data

(63) Continuation of application No. PCT/JP2020/049270, filed on Dec. 29, 2020.

(30) Foreign Application Priority Data

Jan. 20, 2020 (JP) ................................ 2020-006852

(51) Int. Cl.
*H10N 30/87* (2023.01)
*H03H 9/02* (2006.01)
(Continued)

(52) U.S. Cl.
CPC ...... *H10N 30/877* (2023.02); *H03H 9/02574* (2013.01); *H03H 9/13* (2013.01); *H03H 9/14538* (2013.01)

(58) Field of Classification Search
CPC .... H10N 30/877; H09H 9/13; H09H 9/02574; H09H 9/14538
See application file for complete search history.

(56) References Cited

U.S. PATENT DOCUMENTS 7,352,114 B2 * 4/2008 Nakano .............. H03H 9/02992
310/365
2015/0115771 A1 4/2015 Konoma
(Continued)

FOREIGN PATENT DOCUMENTS

JP 2010178198 A 8/2010
JP 2015088896 A 5/2015
(Continued)

OTHER PUBLICATIONS

Office Action in JP2021-573044, mailed Jul. 18, 2023, 3 pages.
(Continued)

*Primary Examiner* — Emily P Pham
(74) *Attorney, Agent, or Firm* — Keating & Bennett, LLP

(57) ABSTRACT

An acoustic wave device includes an IDT electrode on a piezoelectric layer. The IDT electrode includes first and second electrode fingers made of an alloy film including Al and at least one of Cu, Mg, Ag, or Nd, and an overlap region in which the first and second electrode fingers overlap when viewed in the direction of propagation of acoustic waves. The overlap region includes a central region and first and second edge regions outside the central region on opposite sides in the direction in which the first and second electrode fingers extend. In at least one of the first and second electrode fingers, a concentration of the at least one of Cu, Mg, Ag, or Nd in at least a portion of the first and second edge regions is higher than that in the central region.

20 Claims, 2 Drawing Sheets

(51) Int. Cl.
*H03H 9/13* (2006.01)
*H03H 9/145* (2006.01)

(56) References Cited

U.S. PATENT DOCUMENTS

| | | | |
|---|---|---|---|
| 2016/0036410 A1 | 2/2016 | Tsuda | |
| 2018/0212581 A1 | 7/2018 | Matsumoto | |
| 2019/0149128 A1 | 5/2019 | Saji et al. | |
| 2019/0334500 A1* | 10/2019 | Horikawa | H03H 9/02574 |
| 2022/0029601 A1* | 1/2022 | Nagatomo | H03H 9/02637 |

FOREIGN PATENT DOCUMENTS

| | | |
|---|---|---|
| JP | 2019092095 A | 6/2019 |
| JP | 2019102896 A | 6/2019 |
| WO | 2011058930 A1 | 5/2011 |
| WO | 2014171369 A1 | 10/2014 |
| WO | 2017086004 A1 | 5/2017 |

OTHER PUBLICATIONS

International Search Report in PCT/JP2020/049270, mailed Feb. 9, 2021, 3 pages.
Written Opinion in PCT/JP2020/049270, mailed Feb. 9, 2021, 3 pages.

* cited by examiner

ACOUSTIC WAVE DEVICE WITH ELECTRODE FINGERS MADE OF AN ALLOY

CROSS REFERENCE TO RELATED APPLICATIONS

This application claims the benefit of priority to Japanese Patent Application No. 2020-006852 filed on Jan. 20, 2020 and is a Continuation Application of PCT Application No. PCT/JP2020/049270 filed on Dec. 29, 2020. The entire contents of each application are hereby incorporated herein by reference.

BACKGROUND OF THE INVENTION

1. Field of the Invention

The present invention relates to an acoustic wave device including an IDT electrode made of an Al-based alloy film including at least one of Cu, Mg, Ag, or Nd.

2. Description of the Related Art

Japanese Unexamined Patent Application Publication No. 2019-102896 discloses an acoustic wave device whose IDT electrode is made of an Al-based alloy film. The alloy film is one made of an alloy of Al, Cu, and element(s) like Mg or Nd.

Such an Al-based alloy IDT electrode is disadvantageous in that its electric power handling capability is low when the concentrations of the ingredients of Cu and the element(s) such as Mg or Nd is low. Increasing the concentrations of Cu and the element(s) such as Mg or Nd helps enhance the electric power handling capability, but on the other hand, increases a loss of resistance at the electrode fingers of the IDT electrode, creating the disadvantage of increased loss in the acoustic wave device.

SUMMARY OF THE INVENTION

Preferred embodiments of the present invention provide acoustic wave devices each having an improved electric power handling capability and a limited increase in loss.

An acoustic wave device according to a preferred embodiment of the present invention includes a piezoelectric layer and an IDT electrode on the piezoelectric layer, the IDT electrode including multiple electrode fingers. The multiple electrode fingers are made of an alloy film including Al and at least one of Cu, Mg, Ag, or Nd. The multiple electrode fingers include interdigitated first and second electrode fingers, and an overlap region in which the first and second electrode fingers overlap when viewed in a direction of propagation of an acoustic wave. The overlap region includes a central region in a middle in a direction in which the electrode fingers extend, and first and second edge regions outside the central region on opposite sides in the direction in which the electrode fingers extend. In at least one of the multiple electrode fingers, a concentration of the at least one of Cu, Mg, Ag, or Nd in at least a portion of the first and second edge regions is higher than a concentration of the at least one of Cu, Mg, Ag, or Nd in the central region.

The acoustic wave devices according to preferred embodiments of the present invention each have an improved electric power handling capability and a limited increase in loss therein.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following describes specific preferred embodiments of the present invention with reference to drawings to make the present invention clearly understood.

The preferred embodiments described herein are illustrative, and between different preferred embodiments, partial replacement and/or combination of elements, configurations, and arrangements are allowed.

Figure 1A:
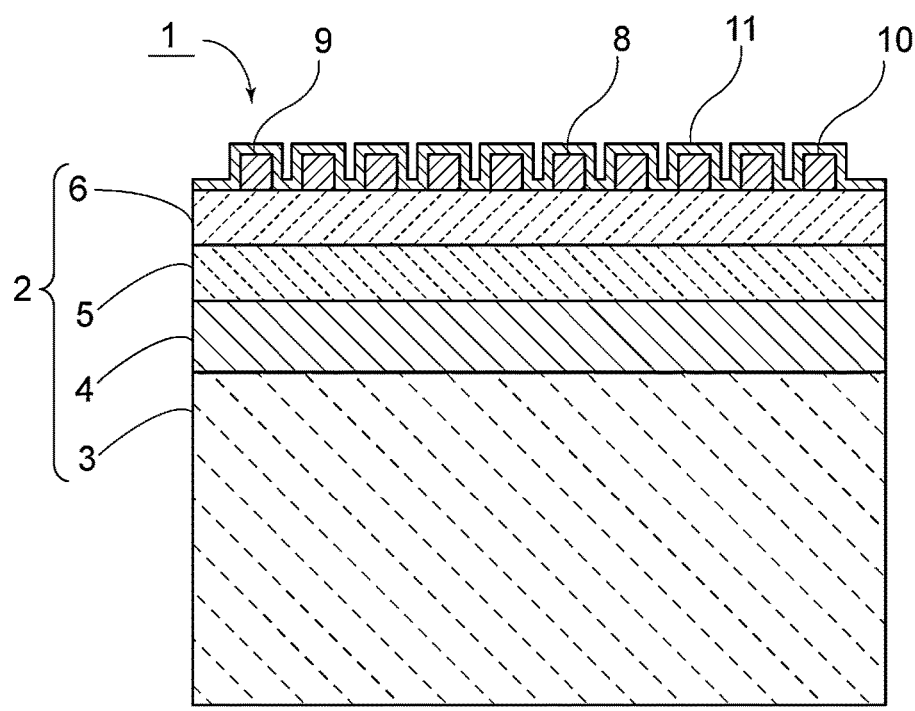
FIG. 1A is a front cross-sectional diagram for describing an acoustic wave device according to a preferred embodiment of the present invention.
Figure 1B:
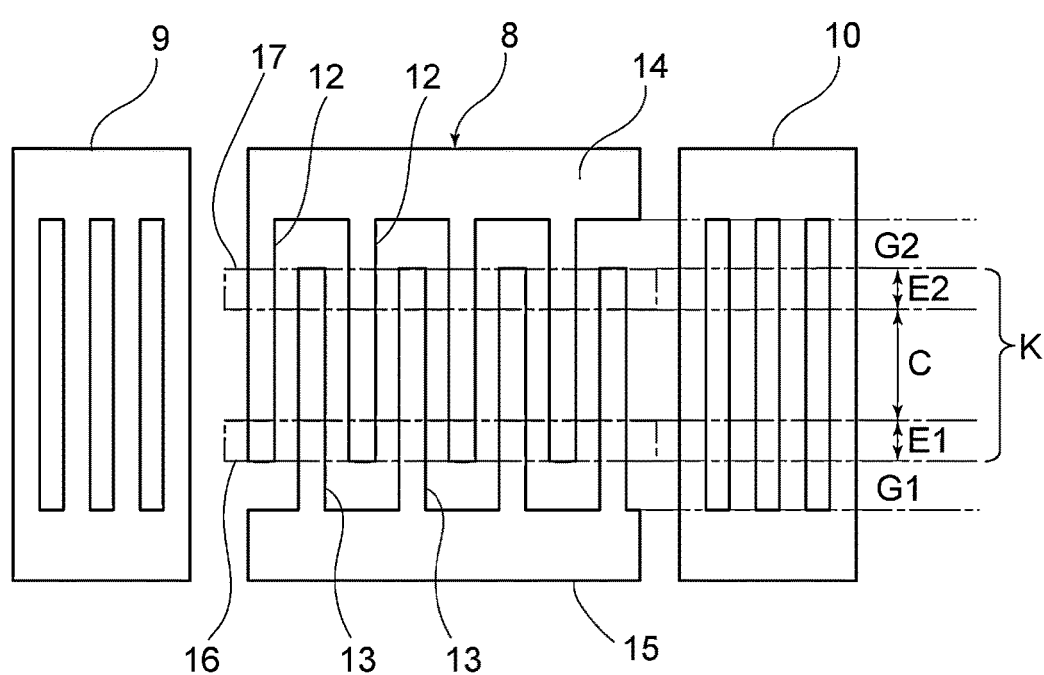
FIG. 1B is a plan view of its electrode structure.

FIG. 1A is a front cross-sectional diagram for describing an acoustic wave device according to a preferred embodiment of the present invention, and FIG. 1B is a plan view of its electrode structure.

The acoustic wave device 1 includes a piezoelectric substrate 2. The piezoelectric substrate 2 includes a support substrate 3, a layer of a high-acoustic-velocity material 4 on the support substrate 3, a low-acoustic-velocity film 5 on the layer of a high-acoustic-velocity material 4, and a piezoelectric layer 6 on the low-acoustic-velocity film 5.

The piezoelectric layer 6 is made of, for example, a piezoelectric single crystal, such as lithium tantalate or lithium niobate. On the piezoelectric layer 6 are an IDT electrode 8 and reflectors 9 and 10. The acoustic wave device 1 is, for example, a one-port acoustic wave resonator, including reflectors 9 and 10 on opposite sides of the IDT electrode 8. In preferred embodiments of the present invention, however, the electrode structure of the acoustic wave device is not necessarily an acoustic wave resonator. The device may be, for example, an acoustic wave filter, which includes multiple IDT electrodes.

A dielectric film 11 covers the IDT electrode 8 and the reflectors 9 and 10. In the present preferred embodiment, the dielectric film 11 is made of silicon oxide, for example. The dielectric film 11 is optional, but improves moisture resistance and protects the electrode structure. The frequency characteristics, furthermore, can be tuned by customizing the thickness of the dielectric film 11. If the dielectric film 11 is made of, for example, silicon oxide or any similar material, it is also possible to adjust temperature characteristics therewith.

The IDT electrode 8 includes multiple first electrode fingers 12 and multiple second electrode fingers 13. One end of the multiple first electrode fingers 12 is coupled to a first busbar 14. One end of the multiple second electrode fingers 13 is coupled to a second busbar 15. The multiple first electrode fingers 12 and the multiple second electrode fingers 13 are interdigitated.

The IDT electrode 8 propagates acoustic waves in the direction perpendicular or substantially perpendicular to that in which the first and second electrode fingers 12 and 13 extend. The region in which the first and second electrode fingers 12 and 13 overlap when viewed in this direction of propagation of acoustic waves is the overlap region K, and the length of this overlap region K in the direction in which the first and second electrode fingers 12 and 13 extend is the overlap width.

The overlap region K includes a central region C, which is in the middle in the direction in which the first and second electrode fingers 12 and 13 extend, and first and second edge regions E1 and E2, which are outside the central region C on opposite sides in the direction in which the first and second electrode fingers 12 and 13 extend. Within the overlap region K, the first edge region E1 is on the side on which the first electrode fingers 12 include their distal end. The second edge region E2 is on the side on which the second electrode fingers 13 include their distal end. The width of the first and second edge regions E1 and E2 (length in the direction in which the first and second electrode fingers extend) is equal to or smaller than about 2λ, where λ is the wavelength, determined by the finger pitch of the IDT electrode 8.

In the first and second edge regions E1 and E2, first and second mass-adding films 16 and 17 are respectively provided. In the present preferred embodiment, the first and second mass-adding films 16 and 17 are made of, for example, a dielectric material.

The first mass-adding film 16, in the first edge region E1, extends from the end of the IDT electrode 8 closer to the reflector 9 to that closer to the reflector 10 for example. The second mass-adding film 17 extends, for example, from the end of the IDT electrode 8 closer to the reflector 9 to that closer to the reflector 10. In other words, both of the first and second electrode fingers 12 and 13 include first and second mass-adding films 16 and 17 in the first and second edge regions E1 and E2. It is, however, sufficient that at least one of the multiple electrode fingers includes a first or second mass-adding film 16 or 17 in the first or second edge region E1 or E2.

The first and second mass-adding films 16 and 17, furthermore, are provided the IDT electrode 8 and the piezoelectric layer 6. That is, the device includes first and second electrode fingers 12 and 13 of the IDT electrode 8 such that they cover a portion of first and second mass-adding films 16 and 17 that have already been formed.

The first and second mass-adding films 16 and 17 in the present preferred embodiment are beneath the first and second electrode fingers 12 and 13, but they may be above the first and second electrode fingers 12 and 13. That is, the first and second mass-adding films 16 and 17 may be on top of the first and second electrode fingers 12 and 13.

The first and second mass-adding films 16 and 17 are made of a dielectric material, for example, silicon oxide in the present preferred embodiment. Silicon oxide, however, is not the only dielectric material that can be used. Any suitable insulator can be used, such as, for example, niobium pentoxide, tungsten oxide, tantalum pentoxide, or hafnium oxide.

Alternatively, the first and second mass-adding films 16 and 17 may be made of an electrically conductive material, such as metal, for example. In that case, the first and second mass-adding films 16 and 17 are arranged so as not to extend to the regions between the first and second electrode fingers 12 and 13. In other words, the first and second mass-adding films 16 and 17 are only positioned right above or right below the first and second electrode fingers 12 and 13 in the first and second edge regions E1 and E2.

A feature of the acoustic wave device 1 is the material used for the IDT electrode 8. Specifically, the first and second electrode fingers 12 and 13 of the IDT electrode 8 are made of an alloy film including Al and at least one of Cu, Mg, Ag, or Nd. In at least one of the multiple first and second electrode fingers 12 and 13, furthermore, the concentration of the at least one of Cu, Mg, Ag, or Nd in at least a portion of the first and second edge regions E1 and E2 is higher than that in the central region C. This enables an increase in the electric power handling capability of the IDT electrode 8 with a limited increase in loss. Preferably, the central region C of the multiple first and second electrode fingers 12 and 13 is an epitaxial film. This helps further improve the electric power handling capability.

For the acoustic wave device 1 according to the present preferred embodiment, the first and second electrode fingers 12 and 13 include a higher concentration of Cu in their first and second edge regions E1 and E2 than in their central region C. In the first and second edge regions E1 and E2, in which the device includes the first and second mass-adding films 16 and 17, none or a small portion of the first and second electrode fingers 12 and is epitaxially grown. The high Cu concentration at non-epitaxially grown distal ends of the first and second electrode fingers 12 and 13 helps improve the electric power handling capability. The inventors of preferred embodiments of the present invention investigated cases of reduced electric power handling capability, and concluded that the cause is a relatively low concentration of Cu, for example, at the distal ends of the first and second electrode fingers 12 and 13 due to the absence of epitaxial growth there. As a solution to this, in preferred embodiments of the present invention, the concentration of Cu, for example, in the first and second edge regions E1 and E2 is higher than that in the central region C. This improves the electric power handling capability, and the associated increase in loss is limited due to a low concentration of Cu, for example, in the central region C.

The interfaces between the central region C and the first and second edge regions E1 and E2 are included in the first and second edge regions E1 and E2. Preferred embodiments of the present invention are advantageous if the concentration of Cu, Mg, Ag, or Nd at the interfaces is higher than that in the central region C.

In preferred embodiments of the present invention, furthermore, the concentration of Cu, Mg, Ag, or Nd does not need to be higher in the entire edge regions than in the central region C. It only needs to be higher in at least a portion of the edge regions than in the central region C. Even this is sufficient for the electric power handling capability to be improved with a limited increase in loss in the acoustic wave device.

Figure 2:
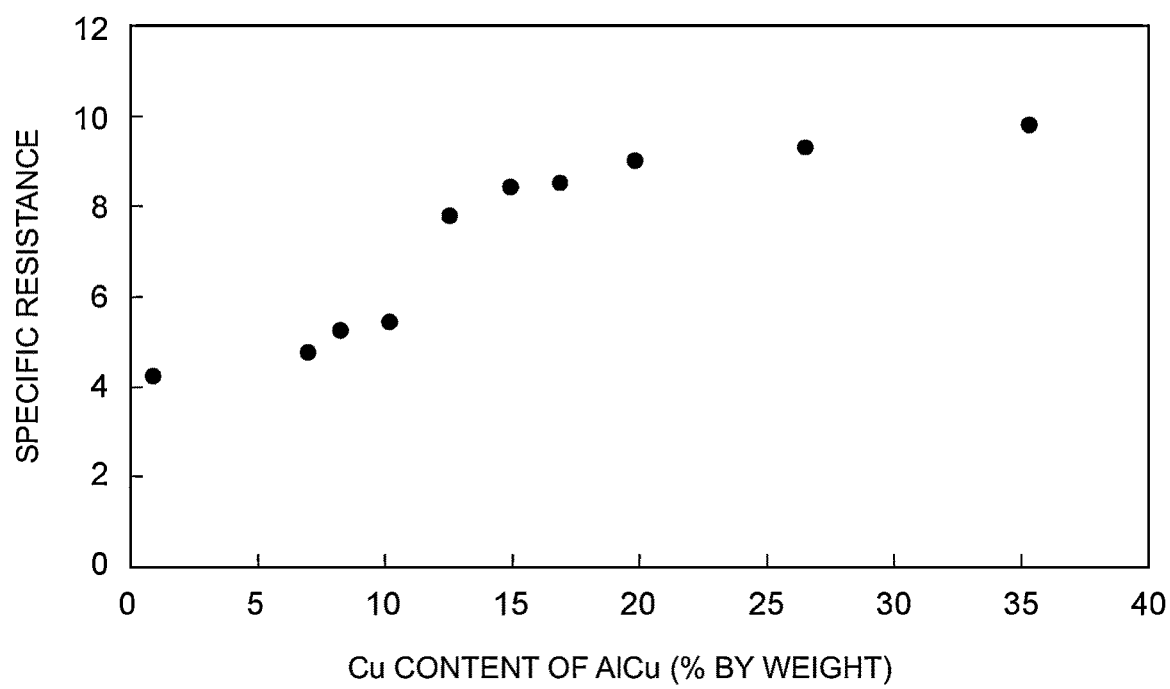
FIG. 2 is a graphical representation of the relationship between the Cu content (% by weight) of an AlCu alloy and the specific resistance of an acoustic wave device.

Preferably, in at least one of the multiple first and second electrode fingers 12 and 13, the concentration of the ingredient of the at least one of Cu, Mg, Ag, or Nd in the central region C is about 10% by weight or less. This limits the increase in insertion loss more effectively. The following describes this with reference to FIG. 2. FIG. 2 is a graphical representation of the relationship between the Cu content (% by weight) of an AlCu alloy in the central region C of the first and second electrode fingers 12 and 13 of the IDT electrode 8 and the specific resistance of the acoustic wave device.

The design parameters of the acoustic wave device 1 were as follows.
 The support substrate 3: Si
 The layer of a high-acoustic-velocity material 4: A SiN film, about 900 nm thick
 The low-acoustic-velocity film 5: A $SiO_2$ film, about 600 nm thick The piezoelectric layer 6: 50° Y-cut LiTaO₃, thickness about 600 nm The IDT electrode 8 and the reflectors 9 and 10: The multilayer structure of a Ti film/an AlCu film/a Ti film. The thickness of the lower Ti film, about 4 nm; the thickness of the upper Ti film, about 12 nm. The thickness of the AlCu film, about 100 nm.

The first and second mass-adding films 16 and 17: Dielectrics made of Ta₂O₅. Thickness about 30 nm.

The first and second electrode fingers 12 and 13 were observed by Electron BackScatter Diffraction Pattern (EBSP), finding that their central region C was an epitaxial film.

As for the first and second edge regions E1 and E2, a portion of them was not an epitaxial film. At the distal ends of the first and second electrode fingers 12 and 13, in particular, the electrode fingers were not epitaxially grown.

The composition of the first and second electrode fingers 12 and 13 in their central region C was primarily Al, with the percentage of Cu being about 1% by weight, about 7% by weight, about 8% by weight, about 10% by weight, about 12.5% by weight, about 15% by weight, about 17% by weight, about 20% by weight, about 26% by weight, or about 35% by weight assuming the amount of AlCu as a whole was 100% by weight.

An elemental analysis was done using energy-dispersive X-ray spectroscopy (EDX), revealing more Cu had precipitated in the first and second edge regions E1 and E2 than in the central region C. In other words, the concentration of Cu in the first and second edge regions E1 and E2 was higher than that in the central region C.

As clearly seen from FIG. 2, the specific resistance increases, and the loss becomes greater accordingly, with increasing concentration of Cu in the central region C. Preferably, the Cu concentration is about 10% by weight or less, and more preferably about 5% by weight or less. This helps reduce the specific resistance significantly, thus limiting the increase in loss more effectively.

The alloy film of the first and second electrode fingers 12 and 13 in the above preferred embodiment is an Al-based one including Cu, but it may be an Al-based alloy film including at least one of Cu, Mg, Ag, or Nd.

In preferred embodiments of the present invention, therefore, the alloy film may have a composition that is primarily Al and includes Mg, may have a composition that is primarily Al and includes Ag, or may have a composition that is primarily Al and includes Nd. It may be an alloy film including two or more elements of Cu, Mg, Ag, and Nd. If the alloy film is primarily Al and includes two or more elements of Cu, Mg, Ag, and Nd, it is sufficient that the concentration of at least one of the two or more elements in the first and second edge regions E1 and E2 is higher than that in the central region C.

In addition, with the acoustic wave device 1 including the aforementioned first and second mass-adding films 16 and 17, the acoustic velocity in the first and second edge regions E1 and E2 is lower than that in the central region C. Outside the first and second edge regions E1 and E2 on opposite sides in the direction in which the first and second electrode fingers 12 and 13 extend, there are first and second gap regions G1 and G2. The acoustic velocity in the first and second gap regions G1 and G2 is higher than that in the first and second edge regions E1 and E2. For the acoustic wave device 1, therefore, ripples caused by the transverse mode are effectively reduced or prevented due to differences in acoustic velocity.

However, this lower acoustic velocity in the first and second edge regions E1 and E2 than in the central region C is not required.

The piezoelectric substrate 2 of the acoustic wave device 1 is a multilayer substrate including a support substrate 3, a layer of a high-acoustic-velocity material 4, a low-acoustic-velocity film 5, and a piezoelectric layer 6. The material for the support substrate 3 in the multilayer substrate does not need to Si, and may be a non-Si semiconductor or an insulator, such as alumina, for example. The layer of a high-acoustic-velocity material 4 is made of, for example, silicon nitride, but any suitable high-acoustic-velocity material can be used for the layer of a high-acoustic-velocity material 4. The term high-acoustic-velocity material refers to a material through which bulk waves propagate faster than acoustic waves propagate through the piezoelectric layer 6. A wide variety of high-acoustic-velocity materials can be used, such as, for example, aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, a DLC (diamond-like carbon) film, or diamond, a medium that is primarily any of these materials, or a medium that is primarily a mixture of these materials. The low-acoustic-velocity film 5 is made of a low-acoustic-velocity material. The term low-acoustic-velocity material refers to a material through which bulk waves propagate more slowly than through the piezoelectric layer 6. A wide variety of low-acoustic-velocity materials can be used, such as, for example, silicon oxide, glass, silicon oxynitride, tantalum oxide, a compound derived by adding fluorine, carbon, boron, hydrogen, or silanol groups to silicon oxide, or a medium that is primarily any of these materials.

The piezoelectric layer 6 may be directly on the layer of a high-acoustic-velocity material.

Furthermore, the low-acoustic-velocity film 5, which is a component of the piezoelectric substrate 2, is optional. The support substrate 3, on which the layer of a high-acoustic-velocity material 4 is disposed, may be a high-acoustic-velocity support substrate, made of a high-acoustic-velocity material. In that case, the layer of a high-acoustic-velocity material 4 is the high-acoustic-velocity support substrate.

The piezoelectric substrate, furthermore, does not need to be structured like the piezoelectric substrate 2 illustrated in FIGS. 1A and 1B. For example, it may have a structure in which a piezoelectric layer is on an alumina or similar support substrate, or the entire piezoelectric substrate 2 may be a piezoelectric single-crystal substrate or similar piezoelectric substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric layer; and
   an IDT electrode on the piezoelectric layer, the IDT electrode including a plurality of electrode fingers; wherein
   the plurality of electrode fingers are made of an alloy film including Al and at least one of Cu, Mg, Ag, or Nd;
   the plurality of electrode fingers include interdigitated first and second electrode fingers, and an overlap region in which the first and second electrode fingers overlap when viewed in a direction of propagation of an acoustic wave;

the overlap region includes a central region in a middle in a direction in which the electrode fingers extend, and first and second edge regions outside the central region on opposite sides in the direction in which the electrode fingers extend; and in at least one of the plurality of electrode fingers, a concentration of the at least one of Cu, Mg, Ag, or Nd in at least a portion of the first and second edge regions is higher than a concentration of the at least one of Cu, Mg, Ag, or Nd in the central region.

2. The acoustic wave device according to claim 1, wherein in all of the first and second electrode fingers, the concentration of the at least one of Cu, Mg, Ag, or Nd in at least a portion of the first and second edge regions is higher than a concentration of the at least one of Cu, Mg, Ag, or Nd in at least a portion of the central region.

3. The acoustic wave device according to claim 1, wherein in the central region of the plurality of electrode fingers, the alloy film is an epitaxial film.

4. The acoustic wave device according to claim 1, wherein in at least one of the plurality of electrode fingers, a concentration of an ingredient of the at least one of Cu, Mg, Ag, or Nd in the central region is about 10% by weight or less.

5. The acoustic wave device according to claim 1, wherein at least one of the plurality of electrode fingers includes a mass-adding film in the first or second edge region.

6. The acoustic wave device according to claim 5, wherein the mass-adding film is between the piezoelectric layer and the first and second electrode fingers.

7. The acoustic wave device according to claim 5, wherein the mass-adding film includes a dielectric material.

8. The acoustic wave device according to claim 5, wherein the mass-adding film includes metal.

9. The acoustic wave device according to claim 1, wherein the alloy film is primarily Al and includes Cu.

10. The acoustic wave device according to claim 1, wherein the alloy film is primarily Al and includes Mg.

11. The acoustic wave device according to claim 1, wherein the alloy film is primarily Al and includes Ag.

12. The acoustic wave device according to claim 1, wherein the alloy film is primarily Al and includes Nd.

13. The acoustic wave device according to claim 1, wherein an acoustic velocity in the first and second edge regions is lower than an acoustic velocity in the central region.

14. The acoustic wave device according to claim 1, further comprising a layer of a high-acoustic-velocity material, through which a bulk wave propagates faster than an elastic wave propagates through the piezoelectric layer, and the piezoelectric layer is directly or indirectly on the layer of a high-acoustic-velocity material.

15. The acoustic wave device according to claim 14, wherein the layer of a high-acoustic-velocity material is a high-acoustic-velocity support substrate made of the high-acoustic-velocity material.

16. The acoustic wave device according to claim 14, further comprising a low-acoustic-velocity film between the layer of a high-acoustic-velocity material and the piezoelectric layer, the low-acoustic-velocity film being made of a low-acoustic-velocity material, through which a bulk wave propagates more slowly than through the piezoelectric layer.

17. The acoustic wave device according to claim 2, wherein in the central region of the plurality of electrode fingers, the alloy film is an epitaxial film.

18. The acoustic wave device according to claim 2, wherein in at least one of the plurality of electrode fingers, a concentration of an ingredient of the at least one of Cu, Mg, Ag, or Nd in the central region is about 10% by weight or less.

19. The acoustic wave device according to claim 2, wherein at least one of the plurality of electrode fingers includes a mass-adding film in the first or second edge region.

20. The acoustic wave device according to claim 19, wherein the mass-adding film is between the piezoelectric layer and the first and second electrode fingers.

* * * * *